United States Patent
Bruce et al.

(10) Patent No.: US 10,505,240 B1
(45) Date of Patent: Dec. 10, 2019

(54) METHODS AND APPARATUS FOR THERMAL ENERGY MANAGEMENT IN ELECTRIC VEHICLES

(71) Applicant: Sunlight Aerospace Inc., Edison, NJ (US)

(72) Inventors: Allan James Bruce, Scotch Plains, NJ (US); Michael Cyrus, Castle Road, CO (US); Sergey Frolov, Murray Hill, NJ (US)

(73) Assignee: Sunlight Aerospace Inc., Edison, NJ (US)

( * ) Notice: Subject to any disclaimer, the term of this patent is extended or adjusted under 35 U.S.C. 154(b) by 0 days.

(21) Appl. No.: 16/170,961

(22) Filed: Oct. 25, 2018

(51) Int. Cl.
| | |
|---|---|
| *H01M 10/46* | (2006.01) |
| *H01M 10/66* | (2014.01) |
| *H01M 10/62* | (2014.01) |
| *H01M 10/659* | (2014.01) |
| *F28D 20/02* | (2006.01) |
| *H01M 10/625* | (2014.01) |

(Continued)

(52) U.S. Cl.
CPC .......... *H01M 10/659* (2015.04); *B60L 58/24* (2019.02); *F28D 20/023* (2013.01); *H01L 31/0525* (2013.01); *H01L 35/30* (2013.01); *H01M 10/46* (2013.01); *H01M 10/617* (2015.04); *H01M 10/625* (2015.04); *H01M 10/66* (2015.04); *H01M 2220/20* (2013.01)

(58) Field of Classification Search
CPC combination set(s) only.
See application file for complete search history.

(56) References Cited

U.S. PATENT DOCUMENTS

| 4,474,171 A | * | 10/1984 | Caproon | ................ | F24S 60/00 |
| | | | | | 126/572 |
| 6,158,225 A | * | 12/2000 | Muto | ................ | B60H 1/00478 |
| | | | | | 62/235.1 |

(Continued)

OTHER PUBLICATIONS

W. Q. Li, Z.G. Qu, Y.L. He, Y.B. Tao, "Experimental study of a passive thermal management system for high-powered lithium ion batteries using porous metal foam saturated with phase change materials", Journal of Power Sources, vol. 255, 9-15, 2014.

(Continued)

*Primary Examiner* — Kaity V Chandler
(74) *Attorney, Agent, or Firm* — Mayer & Williams, PC; Stuart H. Mayer

(57) ABSTRACT

A method and apparatus for the thermal energy management of systems of electrically powered vehicles (EVs), which enhance the mission capabilities, or performance. The method includes an approach in which thermal energy harvesting, dissipation, storage, and distribution operate in concert. The method concurrently enables, immediate and longer-term management, including storage of thermal energy for subsequent use. The apparatus, includes the multi-functional integration of thermal energy storage, for the benefit of enhanced EV form, capabilities or performances. The apparatus includes connecting elements which provide selective, thermal conduction pathways, which link the management system. The thermal conductive pathways may be actuated in response to temperature, or by other activation means. Thermally managed systems which require persistent heating, or cooling or maintenance within a specified range, are addressed.

23 Claims, 6 Drawing Sheets

(51) Int. Cl.
*H01M 10/617* (2014.01)
*B60L 58/24* (2019.01)
*H01L 31/0525* (2014.01)
*H01L 35/30* (2006.01)

(56) References Cited

U.S. PATENT DOCUMENTS

| | | | | |
|---|---|---|---|---|
| 8,587,945 B1* | 11/2013 | Hartmann | ........... | H05K 7/20454 |
| | | | | 361/679.53 |
| 9,570,795 B1 | 2/2017 | Bruce | | |
| 9,802,711 B2 | 10/2017 | Bruce | | |
| 9,841,616 B1* | 12/2017 | Bruce | ................... | G02F 1/0131 |
| 2007/0238008 A1* | 10/2007 | Hogan | .................... | B60R 13/08 |
| | | | | 219/458.1 |
| 2012/0286052 A1* | 11/2012 | Atluri | .................... | B60K 16/00 |
| | | | | 237/28 |
| 2014/0060086 A1* | 3/2014 | Ranalli | ............. | B60H 1/00478 |
| | | | | 62/3.3 |
| 2014/0120399 A1* | 5/2014 | Balandin | ............. | H01M 2/1016 |
| | | | | 429/120 |
| 2014/0290720 A1* | 10/2014 | Hockaday | ............... | H02S 20/30 |
| | | | | 136/251 |
| 2015/0020869 A1* | 1/2015 | Skupien | ................ | H01L 31/048 |
| | | | | 136/251 |
| 2015/0083180 A1* | 3/2015 | Lang | ....................... | H01L 35/30 |
| | | | | 136/207 |
| 2016/0016525 A1* | 1/2016 | Chauncey | ........... | B60R 16/0236 |
| | | | | 701/123 |
| 2016/0043694 A1* | 2/2016 | Price | ....................... | H02S 40/44 |
| | | | | 136/248 |
| 2016/0171890 A1* | 6/2016 | Galli | ................... | G01S 7/52004 |
| | | | | 367/93 |
| 2016/0195340 A1* | 7/2016 | Bissell | ................. | F28D 20/021 |
| | | | | 165/10 |
| 2016/0204484 A1* | 7/2016 | Haensgen | ........... | H01M 10/637 |
| | | | | 320/107 |
| 2016/0223269 A1* | 8/2016 | Hartmann | ........... | H01L 23/4275 |
| 2017/0033411 A1* | 2/2017 | Pais | .................. | H01M 10/4235 |
| 2017/0137344 A1* | 5/2017 | Khurram | ................ | B01J 10/002 |
| 2017/0226395 A1* | 8/2017 | Sutterlin | ................ | C09K 5/063 |
| 2018/0038158 A1* | 2/2018 | Chidiac | .................. | A01G 7/045 |
| 2018/0287231 A1* | 10/2018 | Iyengar | ............... | H01M 10/659 |
| 2018/0347406 A1* | 12/2018 | Friesth | ...................... | F01K 3/00 |
| 2018/0351069 A1* | 12/2018 | Boukai | ................... | H01L 35/30 |

OTHER PUBLICATIONS

Nan Wang, Majid Kabiri Samani, Hu Li, Lan Dong, Zhongwei Zhang, Peng Su, Shujing Chen, Jie Chen, Shirong Huang, Guangjie Yuan, Xiangfan Xu, Baowen Li, Klaus Leifer, Lilei Ye, Johan Liu, "Tailoring the Thermal and Mechanical Properties of Graphene Film by Structural Engineering", Small, vol. 14, 2018.

Hendricks, Terry J., Chang, Chih-hung, Choi, Changho, Krishnan, Shankar, Paul, Brian "Enhancement of pool boiling heat transfer using nanostructured surfaces on aluminum and copper", International Journal of Heat and Mass Transfer, vol. 53, 3357-3365, 2010.

Andrew J. McNamara, Yogendra Joshi, Zhuomin M.Zhang "Characterization of nanostructured thermal interface materials—a review", International Journal of Thermal Sciences, vol. 62, 2-11, 2012.

Kenneth McEnaney, Lee Weinstein, Daniel Kraemer, Hadi Ghasemi, Gang Chen, "Aerogel-based solar thermal receivers" Nano Energy, vol. 40, 180-186, 201.

Ruiting Zheng, Jinwei Gao, Jianjian Wang, and Gang Chen, "Reversible temperature regulation of electrical and thermal conductivity using liquid—solid phase transitions" Nat Comm., 289, 2011, Published online at https://www.nature.com/articles/ncomms1288.

Kelly, "Passive Thermal Management of Lithium-Ion Batteries Using Latent Heat Storage Materials" Electronics Protection Magazine, Summer Issue, 8-9, 2014.

\* cited by examiner

EV STRUCTURAL
ELEMENT WITH
INTEGRATED
THERMAL
STORAGE MEDIA

EV BATTERY WITH
INTEGRATED
THERMAL STORAGE

METHODS AND APPARATUS FOR THERMAL ENERGY MANAGEMENT IN ELECTRIC VEHICLES

FIELD OF INVENTION

The present invention relates to methods and apparatus for the management of thermal energy, including harvesting, dissipation, distribution and/or storage in an electric vehicle (EV), and subsystems, in order to benefit, or enhance, EV form, capabilities and/or performance. A particular focus being on untethered EVs, including manned, unmanned, terrestrial, airborne, and extraterrestrial EVs.

BACKGROUND

Untethered, manned and un-manned, EVs are increasingly employed, or considered, for transportation, or other missions, on land, sea, air and extraterrestrial locations. The inability of many EVs to operate in extreme environments and/or for extended, long-endurance, missions is a frequent limitation. As EV usage increasingly overlaps with wider human activity, operational safety also becomes more of a challenge and concern.

Untethered, manned and un-manned, EV operation and safety critically depends on the ready availability of sufficient electrical power for propulsion, operating systems and payloads. Electrical power systems, which support these functions typically include a battery, a means of charging the battery, a means of power distribution and control, to EV sub-systems. The means of charging may be pluggable, or deliverable, external sources and/or in-vehicle generation systems, such as fueled generators, or renewable sources, such as solar Photovoltaic (PV) cell arrays. Pluggable charging may require mission interruption, deliverable sources are vulnerable and fueled options are exhaustible. Solutions which include in-vehicle renewable sources are the only option for uninterrupted, long-endurance, missions.

The performance of EV power systems is critical for operational capabilities and endurance. The performance of power systems, and components, may depend on the operating environment including temperature. For example, PV sub-systems are most efficient at low temperature, while batteries, such as Li-ion batteries, typically deliver optimum performance within a specific range of temperatures, below which they are less efficient and above which they can be prone to catastrophic failure. Operating, or storing, batteries at non-optimal temperatures may also degrade their performance, or accelerate degradation during subsequent use. Self-heating effects during charging and discharging may also cause degradation, if there is insufficient means to dissipate the heat and maintain temperature within an optimum range. A means of thermal energy management, for maintaining preferred operating temperatures in EVs, each subsystem and/or component is therefore desirable.

Thermal energy management in EVs and sub-systems, including power systems, can be critical for the capabilities, performance, endurance and operational lifetime of an EV. Traditional thermal energy management is typically focused on the separate management of individual systems or components. This approach can result in net increases in size, weight, power-consumption, manufacturing complexity and cost of the EV, which can impair the mission capabilities and endurance. More holistic, or integrated, thermal management solutions for EVs and subsystems, which minimize such impairments are desirable. The present invention falls within this domain.

The present invention provides, a holistic, integrated, thermal energy management solution, which can provide advantages in size, weight, power, manufacturing and/or cost of EVs and subsystems, in comparison to traditional energy management approaches. The invention may include "coupled" thermal management of components, with inverse temperature requirements, such as PV cells and batteries, and/or the implementation of multi-functionality within EV structures, or subsystems, such as thermal energy storage within the frame or the battery. Such solutions may be passively, or actively, initiated and may be configured to manage EV performance up to the mission level rather than just the system, or component, levels.

There are EV missions, where it may be advantageous for an EV to have a net absorption, or acquisition, of thermal energy from external, preferably renewable, sources such as sunlight. For example, missions in cold environments, where the environmental temperatures are predominantly below the optimal operational range for the EV, subsystems or components.

There are EV missions, where it may be advantageous for an EV to have a net loss, or dissipation, of thermal energy to the surroundings, by conductive, convective or radiative means. For example, missions in hot environments, where the environmental temperatures are predominantly above the optimal range for the EV, subsystems or components.

There are EV missions, where the environment temperature may vary both below, and above, critical operating temperatures of the EV, subsystems or components. For example, missions which include diurnal conditions or variable locations.

There are EV missions, where it may suffice to alternate between thermal absorption or thermal dissipation operation, in order to thermally manage the EV, subsystems and components.

There are EV missions where it may be advantageous, or necessary, to store thermal energy during some periods of the mission to provide a reserve to offset other periods which have a deficiency.

Thermal energy management systems, will ultimately be dependent on the controllable, or predictable, distribution of thermal energy within the EV, and to, or from, their surrounding environment. The integration of thermal interconnects, backplanes, or conduits, between systems or components in the EV can support such distribution and the addition of means to passively, or selectively, enable, or interrupt, thermal energy transport along these pathways can provide a means of management and control.

SUMMARY

In one aspect, the invention provides a method or apparatus which enables thermal energy harvesting, storage, distribution and/or dissipation in an EV, its systems and/or components. The method or apparatus further include means of thermal energy transfer between subsystems, or components, and means for the activation and/or interruption, of said transfer. The overreaching goal is to attain, or sustain, operating conditions under which capabilities, or performance, of an EV, it's system, or component are enhanced, or maintained, at desired levels, with minimal detriment to its size, weight, operating power, and/or other key parameters. The method or apparatus further includes the capability for single, or multiple, systems, or components, to be thermally managed simultaneously, individually, or in-concert.

In another aspect, the method or apparatus further includes the capability of thermal management, instantly, continuously, and/or throughout the duration of an EV mission, or sequential missions, which may be different in scope.

In another aspect, the invention provides a method or apparatus for an EV that has a self-regulating, passive, or activated, means of thermal energy distribution between individual, or multiple, subsystems, or components, singularly, or in-concert, to enhance the EV capabilities or performance.

In another aspect, various materials and/or structures may be employed individually, in-sequence, or in-concert, to support the connectivity and/or control functions of the thermal management system. Examples include, using phase change materials (PCM) for thermal energy storage, aerogels for insulation, nano-structured materials for thermal interfacing, assembled monolayer graphene layered backplanes, or other conduits, for thermal conduction, and materials with dispersed conductive phases which can be selectively, or predictably, aggregated, or dispersed, to enable, or interrupt, thermal energy transport.

In another aspect the thermal conducting interconnects, backplanes, or conduits, may be integrated into elements of the EV structure, including but not limited to, the skin, or the frame.

In another aspect, the invention provides a method or apparatus for thermal energy storage which is integrated within the structure or other functional components of the EV, including, but not limited to, structural elements of the EV, such as the frame, skin, and/or subsystems, or components, of the EV, such as batteries or payloads. Advantageously, such structures and components are frequently made from metals, or composite materials, which have a high capacity for thermal energy storage.

In another aspect, the thermal storage capacity of the EV structure or other components, may be enhanced by incorporating PCM within the structure, or functional components. This may be additive, substitutional, or partially substitutional, with regard to mass, in order to approach "mass neutral", or even "mass reduced", preferred solutions. PCM materials typically absorb, and release, thermal energy at a first-order, solid-liquid, phase transformation. A system containing PCM may thus reversibly buffer the temperature response during heating, or cooling at a transformation temperature due to the respective absorption or release, of thermal energy during the transformation. Such behavior may be utilized to restrict egressions from a desired range of operational temperatures of a subsystem, up to the energy storage capacity of the PCM present. More elaborate temperature management may be achieved by incorporating multiple PCMs, with different transformation temperatures, in systems or components. For example, two PCMs may be employed, with transitions corresponding to upper and lower limits of a desired temperature range of a component, for example a battery.

In another aspect, the invention provides a method or apparatus for thermal energy harvesting, which may include a mechanically durable skin, or film, that enables solar thermal energy harvesting, distribution, storage and/or management. The skin may further be engineered, structured, or textured for enhanced performance and deployed across all, or part, of the surface of the EV. Different skins may also be used at different EV locations.

In another aspect, the invention provides a method or apparatus for thermal energy dissipation to the surrounding environment, which may include a mechanically durable skin, or film, that enables thermal energy dissipation through conduction, convection or radiative emission. The skin may further be engineered, structured, or textured for enhanced performance and deployed across all, or part, of the surface of the EV. Different skins may also be used at different locations.

In another aspect, said skins, or films, may be distinguished from traditional solar thermal harvesting, dissipation, distribution and management apparatus in that they can be integrated with existing EV structures, materials or components. The distribution, structure and/or texture of the skin, or film, may be selected, or engineered, such that critical values of size, weight, power, or other desired features are consistent with specific EV designs and missions.

In another aspect, said skins, or films, may have means to store thermal energy.

In another aspect, said skins, or films, may have means to supply thermal energy to other subsystems, or components in the EV.

In another aspect, said skins, or film, may have means to accept thermal energy from various subsystems, or components in the EV.

In another aspect, the invention provides, for centralized or distributed thermal storage elements.

Distributed thermal storage elements, may be selectively interconnected and operate separately, or in-concert, to thermally manage single, or multiple, EV systems.

For a centralized thermal storage element, single or multiple systems which require thermal management may be connected to the storage element.

Distributed thermal storage elements, may be advantageously employed in the management of specific EV systems, based on their location and/or required management function, for example heating or cooling.

The method of selective thermal interconnections may be an element in the thermal energy transport pathway which is activated, or engaged, at a specific temperature, or by another means such as an electrical signal.

In another aspect, the invention addresses the thermal management of EV systems which can be selectively connected to thermal storage elements.

The primary mechanism of thermal management is the natural flow of thermal energy down a thermal gradient. This can support the transfer of heat from a connected storage element which is hotter than the managed system, or the extraction of heat from a managed system which is hotter than a connected storage element. In this regard it is advantageous to be able to alter the temperature of the storage element, through the transfer of thermal energy to, or from, another connected system, which may be a harvesting system, a dissipation system, a storage element, or another system.

An alternative approach is to employ separate thermal storage elements connected to the managed system, for the selectable delivery, or extraction, of thermal energy from the managed system, respectively.

The invention also allows for the inclusion of additional systems including heating and/or cooling systems, such as electrical, or radio frequency (RF) devices, which may be selectively connected to the thermal storage element(s) for the purpose of adjusting their temperature, or stored thermal energy.

Various materials including metals, semi-conductors, non-metals, polymers, elemental carbon-based materials, and/or composites may be employed with established engineering practices and design methods to achieve desired skin, or film, characteristics. Different material structures including porous, particulate, nano-sized, or nano-structured, materials may also be employed.

In another aspect, harvested thermal energy may originate from other EV systems, such as PV cells, batteries, communications equipment, microprocessor-based equipment, or other components. A focus being components from which generate heat in operation and from which this heat must be extracted in order to function efficiently. Traditionally, such components can be encumbered with external heat sinks, or cooling devices, to achieve this goal. Such encumbrances may be minimized, or eliminated, by the methods, or apparatus, of the present invention.

In another aspect, the method and apparatus, can include a facility to dissipate thermal energy from the structure, sub-systems and/or components of an EV, through conductive, convective or radiative means. This might be implemented using natural, or forced, fluid, including air, flow over the skin, or surface, of an EV, including airborne, or maritime, EVs, or in some cases by conduction to the surroundings for example from terrestrial EVs.

In another instance, the external source of non-thermal, or thermal, energy to the thermally managed system may be another EV.

In another aspect, the thermal management system of the EV may remotely access geo-locating/navigation/time/seasonal and weather information, to anticipate requirements in order to pre-adjust control settings for matching thermal harvesting, dissipation and storage, or other aspects. Such monitoring and information systems are already part of the control and navigation systems in many EVs. The thermal management system may also include systems which facilitate circumstance recognition, or deep learning, to further refine and optimize pre-adjustments of control settings to improve thermal management.

In another aspect, the invention may include the implementation of multi-level thermal management and control in an EV, to further optimize EV size, weight, power, endurance, or other capabilities. For example, at the mission level, the management system and thermal storage capacity may be designed, or configured to meet the requirements of the specific mission plan, in terms of location, duration, anticipated environmental conditions and managed subsystem requirements. This can include predetermined harvesting and dissipation of thermal energy, carried out in advance of a need. This is a long-term management approach, which may be preprogrammed. Reprogramming is also be possible, with sufficient lead time, based on external communications, for example via internet of things (TOT) connectivity in combination with activated selective thermal distribution within the EV.

Thermal management may be adjusted or reconfigured in-response to more near-term predicted events, such as location, navigation, weather forecast and EV subsystem demands, for example power requirements, communications and data processing. Within the available response time, these needs may at least be partially offset at the thermal storage system, via possible harvesting, dissipation or redistribution of thermal energy.

Instantaneous thermal energy demands, however will typically be met by the selective distribution of thermal energy from, or to, the storage medium. This primarily occurs at the local level within the EV.

In many instances, the thermal management system may be enhanced by using, or "piggy-backing" on, communication systems and/or sensors already present in the EV. These may include geo-locating systems, such as GPS, navigation systems, and communication systems including IOT connectivity.

In another aspect, the invention provides for centralized thermal storage elements which are partitioned.

In another aspect, the distributed, or partitioned storage elements may operate independently, or in a coordinated fashion.

In another aspect, where the distributed, or partitioned storage elements may be designed or constructed to support different thermally managed systems, which require management at the same, or different temperatures, and/or a different capacity to buffer temperature changes.

In another aspect, the distributed, or partitioned storage elements may contain, the same or different PCMs and/or different thermal masses or these PCMs.

In another aspect, the storage element and managed system may be one and the same, such as a battery.

In another aspect, the managed battery, or batteries, may have different characteristics including, electrical specifications, desired operating temperature range and desired storage temperature range.

In another aspect, managed batteries, with thermal storage capability, may be operated in-concert to support their synergistic thermal management for EV mission objectives. In another aspect, the storage element, may include a battery and a structural element of the EV. This combination may advantageously support, the centralization, partitioning, or distribution of batteries, their selective thermal connectivity, or insulation, for potential benefits in EV form, capabilities and/or performance.

In another example, a number of centralized, partitioned, or distributed batteries which may have different thermal storage capability, which may have different electrical specifications, and which may include structural elements of the EV, may be operated cooperatively, in response to a mission requirement. For instance, low temperature nighttime operation of an EV, it may be advantageous to first operate a battery, designed for low temperature. To date, such batteries have inferior performance, but may produce sufficient electrical energy, or thermal energy as a by-product, to heat a more efficient higher temperature battery. In this way, "ignition" batteries may be used to enable higher performance batteries to attain their optimal temperature range, without the degradation which would occur if such batteries were engaged at low temperature.

In another aspect, the thermal harvesting system of a thermal management system, may include a thermo-electric generator, which may be used to generate electrical energy. The thermo-electric generator may be a Seebeck generator, or another type of generator.

In another aspect, the thermal harvesting system may be used to generate electrical energy, which may be stored or used for various EV applications including thermal management.

In another aspect, the thermal harvesting system may be used to generate both thermal and electrical energy, which may be stored or used for various EV applications including thermal management.

Embodiments of the present invention, summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
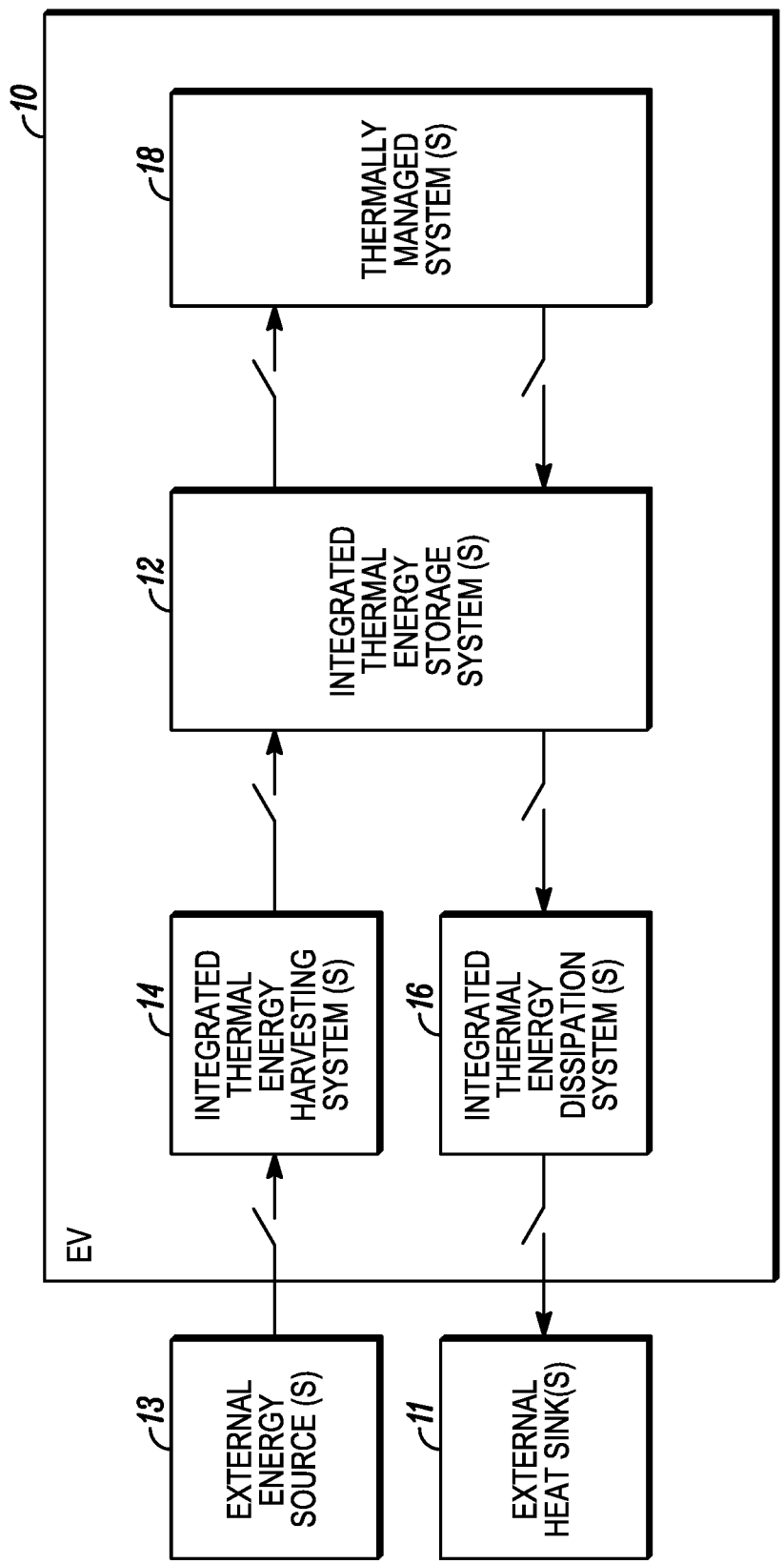
FIG. 1 represents one example of the functional elements of a holistic, integrated, thermal management system in an EV.

In one aspect, the current disclosure relates to thermal management systems integrated within the EV structures and/or subsystems to achieve advantages in size, weight, operational power requirements or other benefits for the EV form or capabilities.

There is extensive material available which may be used as resources for implementing various embodiments of the subject matter disclosed herein. For example, many resources are available concerning the thermal properties of materials, structures and system engineering, including, thermal conduction, thermal interfaces, temperature-gradient driven, or pumped, heat flow. PCMs, which are pertinent for thermal energy storage, are well documented, including inorganic, organic and mixed materials, in bulk, or dispersed form, which span an almost unlimited temperature range. There are commercial suppliers, including PureTemp LLC, Plymouth MN, that provide custom PCMs, for different applications and temperatures.

Other recent advances, in science and technology areas, also have the potential to be pertinent in the implementation of some embodiments of the current invention. Examples include; (i) The incorporation of PCMs in encasements for the local thermal management of Li-batteries (see, for example, J. Kelly, "Passive thermal management of Li-ion batteries using phase change materials, Electronics Protection Magazine, Summer Issue, 8-9, 2014; and W. Q. Li, Z. G. Qu, Y. L. He, Y. B. Tao, "Experimental study of a passive thermal management system for high-powered lithium ion batteries using porous metal foam saturated with phase change materials", Journal of Power Sources, Volume 255, 9-15, 2014), (ii) assembled monolayer graphene sheets, which are thin and lightweight, with high thermal conductivity for efficient thermal energy transport (see, for example Nan Wang, Majid Kabiri Samani, Hu Li, Lan Dong, Zhongwei Zhang, Peng Su, Shujing Chen, Jie Chen, Shirong Huang, Guangjie Yuan, Xiangfan Xu, Baowen Li, Klaus Leifer, Lilei Ye, Johan Liu, "Tailoring the Thermal and Mechanical Properties of Graphene Film by Structural Engineering", Small, Vol 14, 2018.), (iii) nanostructured thermal interface materials (TIM) which enable rapid thermal transport across component, or sub-system, interfaces (see, for example Hendricks, Terry J., Chang, Chih-hung, Choi, Changho, Krishnan, Shankar, Paul, Brian "Enhancement of pool boiling heat transfer using nanostructured surfaces on aluminum and copper", International Journal of Heat and Mass Transfer, Volume 53, 3357-3365, 2010; and Andrew J. McNamara, Yogendra Joshi, Zhuomin M. Zhang "Characterization of nanostructured thermal interface materials —a review", International Journal of Thermal Sciences, Volume 62, 2-11, 2012), (iv) aerogel layers or coatings for thermal insulation (see, for example, Kenneth McEnaney, Lee Weinstein, Daniel Kraemer, Hadi Ghasemi, Gang Chen, "Aerogel-based solar thermal receivers" Nano Energy, Volume 40, 180-186, 201) and (v) composite materials with dispersed conductive materials therein, which can have a tunable electrical and/or thermal conductivity so that they provide tunable electrical and/or thermal conduction pathways when the temperature of the carrier material falls below or above critical values (see, for example Ruiting Zheng, Jinwei Gao, Jianjian Wang, and Gang Chen, "Reversible temperature regulation of electrical and thermal conductivity using liquid-solid phase transitions" Nat Comm., 289, 2011, Published online at https://www.nature.com/articles/ncomms1288).

Although the systems and techniques described herein have general applicability for EVs, they are particularly advantageous, and may be mission enabling, for untethered EVs operating in challenging environments, such as extreme hot, or cold, environments, airborne, Space, and long endurance missions, in which EVs and subsystems, may be required to operate for days, month, or even years.

FIG. 1 depicts a holistic thermal management system for an EV, which includes energy input from an external source, for example the sun, thermal harvesting of this energy by an EV integrated sub-system, followed by selective transfer to an EV integrated storage sub-system, then it's selectable, or predictable, transfer to an EV subsystem which may require thermal energy to attain a desired operating temperature. Conversely, if the managed EV subsystem is required to expel thermal energy to attain a desired operating temperature, said energy can be selectively, or predictably, transferred to an integrated storage subsystem, where it may be retained for subsequent reuse or selectively, or predictably, transferred to an integrated thermal dissipation subsystem and from thence to the external environment. The selective, or predictable, transfer of thermal energy may be achieved by employing interconnects, backplanes, or other structures which can serve as conduits between the various subsystems, with, additional elements or interfaces which may be coupled, or uncoupled, to exhibit, directional or bi-directional, thermally conductive, or insulating behavior, in response a change in temperature, or by another activation means.

More particularly, FIG. 1 shows a holistic, integrated, thermal management system 10 in an EV that includes a thermal energy storage subsystem 12, a thermal energy harvesting subsystem 14, a thermal energy dissipation subsystem 16, and a managed subsystem 18, along with their interconnections and optional harvesting, or dissipation, of thermal energy from, or to, the surrounding external environment (e.g., harvesting energy from an external energy source 13 such as the sun and dissipating energy to external thermal energy sink, such as the environment 11).

Figure 2:
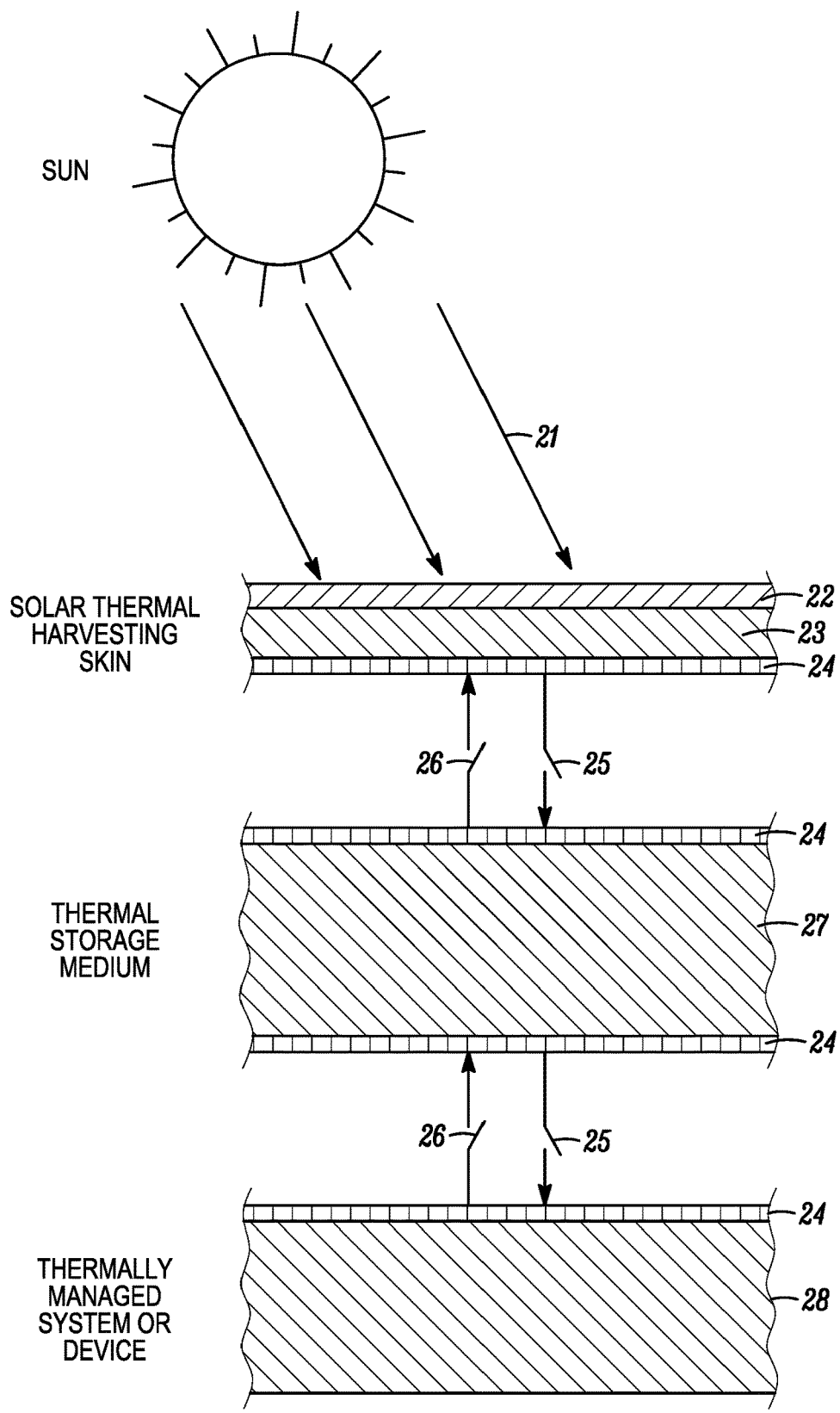
FIG. 2 represents another example of the functional elements of a thermal management system in an EV, which includes a solar thermal harvesting skin, an integrated thermal storage sub-system, a thermally managed sub-system, or device and thermal interconnection of these systems.

FIG. 2 depicts an example of a multi-functional solar thermal harvesting skin which can be deployed across the surface, or frame, of an EV. Incident Sunlight 21 impinges on, and can penetrate, the outer layer(s) of the skin 22. Such layer(s) may be transparent, or functional layer(s), for example, de-icing, anti-icing, reflective, anti-reflective, PV, antenna or other functionality. The layer(s) may also impart a level of conversion of photon energy to thermal energy through various mechanisms. Examples of skins or films that may be suitable for skin 22 in certain embodiments may be found, for example, in U.S. Pat. Nos. 9,841,616, 9,802,711 and 9,570,795, which are each incorporated by reference herein in their entirety. These skins or films may incorporate different sublayers to perform such functions as de-icing, anti-icing, solar energy harvesting (by photovoltaic cells) and have a reflectivity that is tunable upon flexing.

An underlying layer 23 is specifically designed to absorb and convert substantially all remaining light transmitted by layer 22 into thermal energy as well as being sufficiently thermally conductive to, and from, layer 22. Layer 23, may also provide local storage of thermal energy. Layer 24 is an interfacing layer, or backplane which provides a gateway for thermal energy transfer, from the thermal harvesting skin to a thermal storage medium, or device, through a selectively actuatable thermal energy transfer conduit 25, which may be directional, interruptible, switchable, selectable, or tunable. The conduit may be an integral part or the EV skin, frame, or another subsystem. Thermal energy may similarly be transferred in the reverse direction via the same, or another, selectively actuatable thermal energy transfer conduit 26 that is similar to conduit 25. Selection may be passively activated by temperature, another passive, or active, means. The selectively actuatable thermal energy transfer conduits 25 and 26 may be formed from the aforementioned composite materials with dispersed conductive materials therein, which can have a tunable electrical and/or thermal conductivity so that they provide tunable electrical and/or thermal conduction pathways that when the temperature of the carrier material falls below or above critical values. In this way selective thermal communication can be established between the components or subsystems that the conduits connect.

The thermal storage medium 27, may be adjacent to, or remote from, the skin. It may incorporate a thermally conductive outer layer 24 and be connected to the skin though the conduit 25. The thermal storage medium can be similarly, but independently, interfaced to other devices or systems 28, such as batteries, which require thermal management. The storage medium may be isolatable, and ideally be designed to have sufficient heat capacity to support the accumulation, or release, of energy for the thermal management of the EV systems or components, throughout an EV mission.

Figure 3:
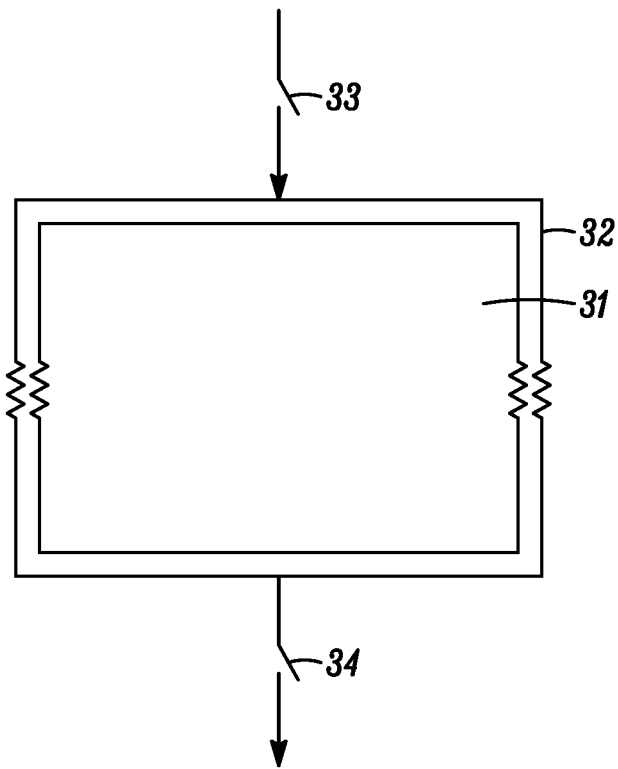
FIG. 3 represents one example of a thermal storage subsystem which is integrated within a structural element of an EV frame and its thermal interconnection.

FIG. 3 depicts a multi-functional thermal storage system in which a structural element 31 of an EV is used as the storage medium. This may be realized with the unmodified structural element, or by modification of the structural element, for example with the incorporation of PCMs within the structure. Thermal interfacing of the structural component with other subsystems and components is accomplished with appropriate thermal interface layers 32 and selectively actuatable thermal energy transfer conduits 33 and 34, which may be an integral part or the EV, skin, frame, or another subsystem. The selectively actuatable thermal energy transfer conduits 33 and 34 may be formed from the aforementioned composite materials with dispersed conductive materials therein, which can have a tunable electrical and/or thermal conductivity so that they provide tunable electrical and/or thermal conduction pathways that when the temperature of the carrier material falls below or above critical values.

Figure 4:
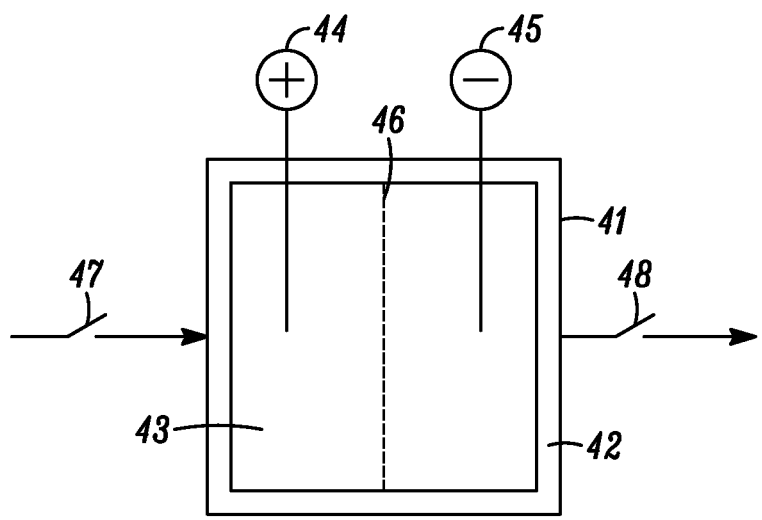
FIG. 4 represents another example of a thermal storage subsystem, which is integrated within a electrochemical battery of an EV and its thermal interconnection.

FIG. 4 depicts a multi-functional thermal storage system in which an EV electro-chemical battery 41, comprising of an outer casing 42, electrolyte material 43, anode 44, cathode 45, and a conductive membrane 46 with appropriate thermal interface layers and selectively actuatable thermal energy transfer conduits 47 and 48. This is a particularly attractive solution since batteries frequently constitute a sizeable fraction of total EV mass.

In one embodiment the invention provides a thermal management system which incorporates skins or films that are mechanically durable and which support solar thermal harvesting. These may be deployed across all available surface of an EV subject to solar illumination, representing the widest use application for solar harvesting skins.

In other embodiments, skins with other designed functionalities, such as PV, or de-icing would incorporate, thermal harvesting and/or release functionality typically in layers below the aforementioned characteristics. In the instance of PV skins, thermal harvesting could be implemented directly from impinging sunlight or indirectly from thermal energy via the PV cells. A benefit in this instance would be to effect cooling of the PV cells for better performance. In the instance of de-icing, an express purpose could be the delivery of harvested and/or stored thermal energy to the de-icing layers.

In other embodiments, thermal energy delivery, extraction, or both, may be required for the thermal management of specific systems or components under different conditions, for example batteries.

In other embodiments, mission parameters may require the thermal management system to be designed to primarily heat EV systems and components. For example, in winter, artic or high-altitude conditions.

In other embodiments, mission parameters may require the thermal management system to be designed to primarily cool EV systems and components and dissipate heat to the surroundings. For example, in tropical or summer conditions.

Figure 5:
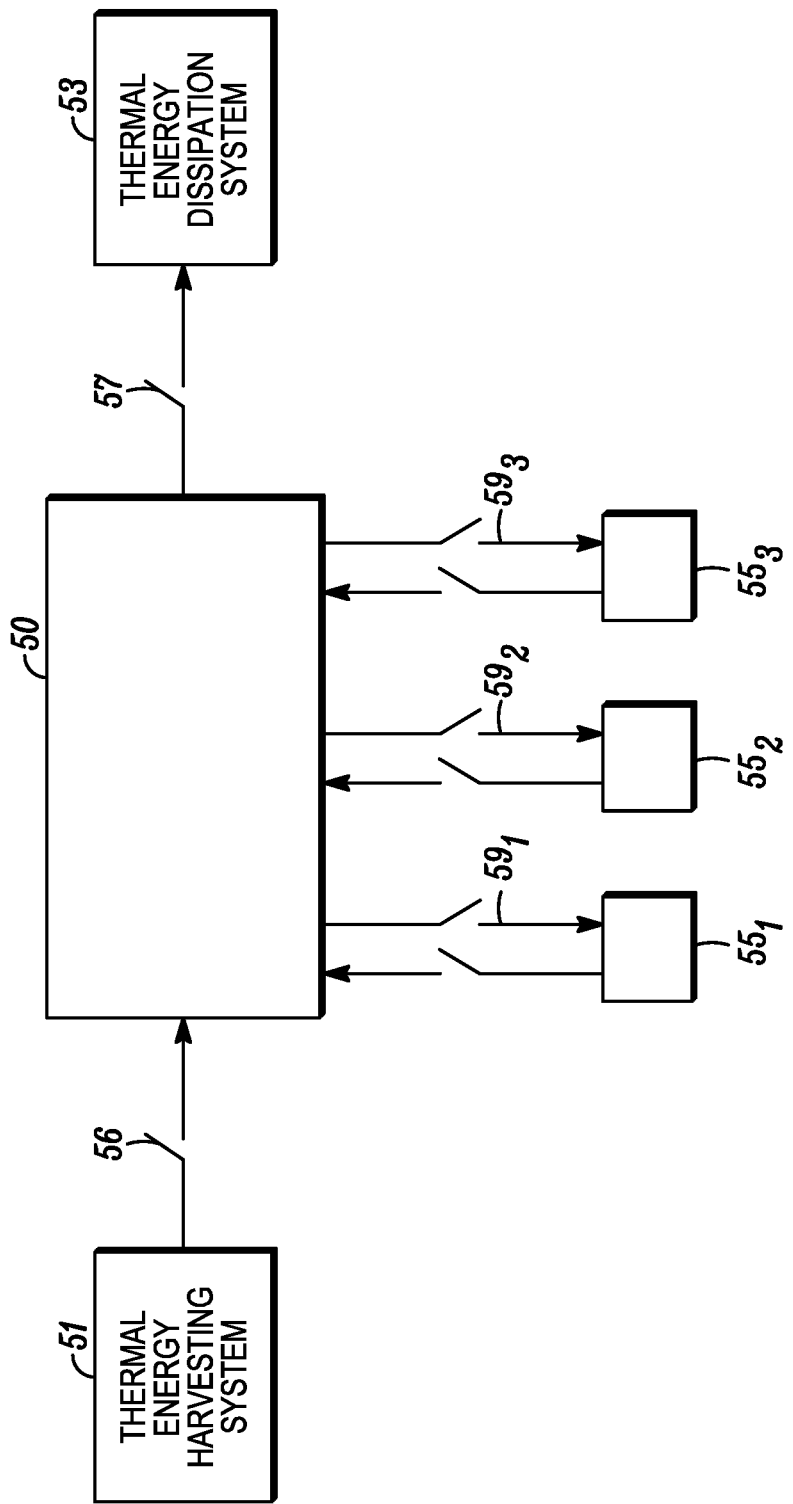
FIG. 5 represents an example of a thermal storage medium that comprises a centralized thermal storage element in which single or multiple systems that require thermal management are connected to the centralized thermal storage element.

As illustrated in FIG. 5, in some embodiments the thermal storage medium may comprise a centralized thermal storage element 50 in which single or multiple systems $55_1$, $55_2$ and $55_3$ which require thermal management may be connected to the storage element 50 via selectively actuatable thermal energy transfer conduits $59_1$, $59_2$ and $59_3$. The storage element is in selective thermal communication with thermal energy harvesting system 51 via selectively actuatable thermal energy conduit 56 and a thermal energy dissipation system 53 via a selectively actuatable thermal energy conduit 57.

Figure 6:
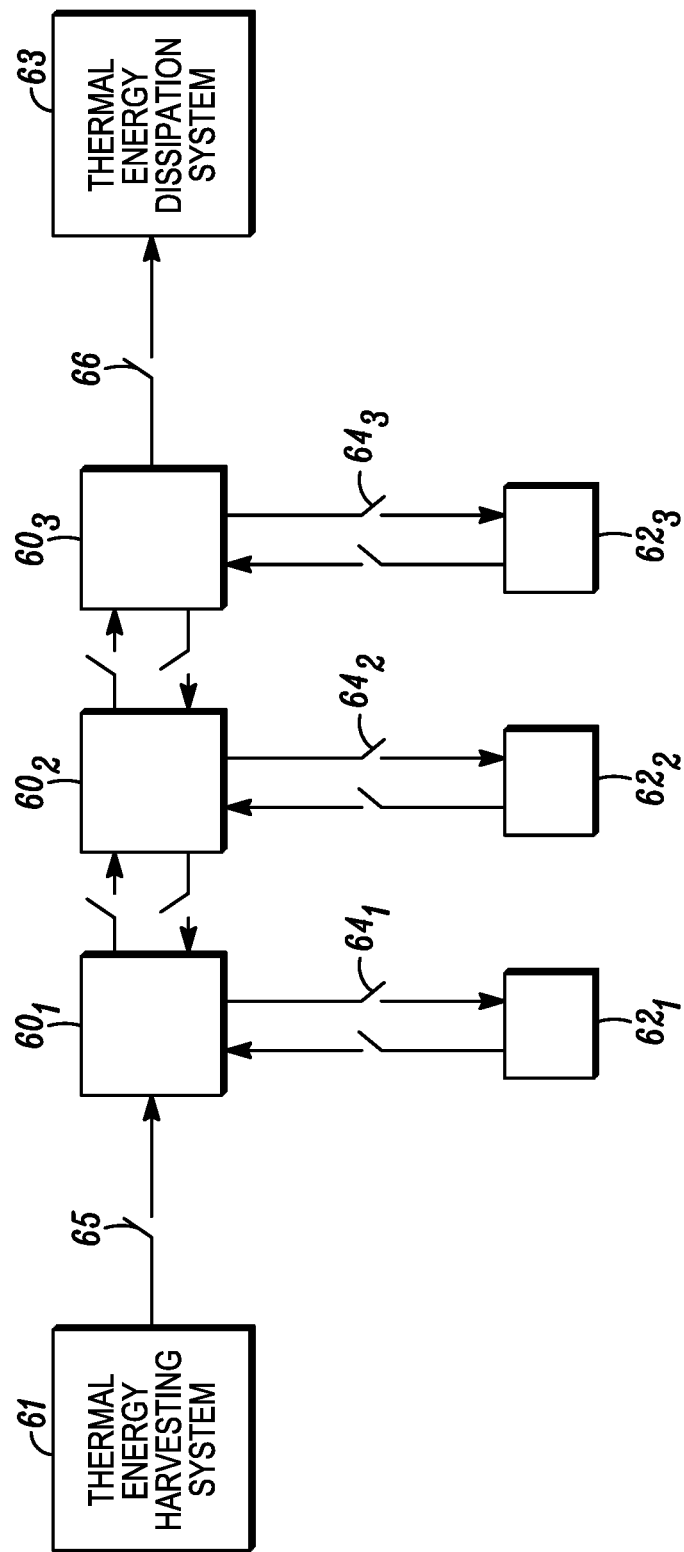
FIG. 6 represents an example of a thermal storage medium that comprises a series of distributed thermal storage elements that are each in selective thermal connection with different systems which require thermal management.

As illustrated in FIG. 6, in some embodiments the thermal storage medium may comprise a series of distributed thermal storage elements $60_1$, $60_2$ and $60_3$, which may be advantageously employed in the management of specific EV systems, based on their location and/or required management function, e.g. heating or cooling. Thus, in FIG. 6 each thermal storage element is in selective thermal communication via selectively actuatable thermal energy conduits to its own thermally managed system(s). In particular, thermal storage elements $60_1$, $60_2$ and $60_3$ are in selective thermal communication with thermally managed systems $62_1$, $62_2$ and $62_3$, respectively, via selectively actuatable thermal energy transfer conduits $64_1$, $64_2$ and $64_3$. The thermal storage elements $60_1$, $60_2$ and $60_3$ are themselves in selective thermal communication via selectively actuatable thermal energy conduits 65 and 66, with thermal energy harvesting system 61 and thermal energy dissipation system 63, respectively. In some cases, such as shown for thermal storage element $60_2$, the selective thermal communication with the thermal energy harvesting system 61 and/or the thermal energy dissipation system 63 may employ a path that includes another thermal storage element.

Figure 7:
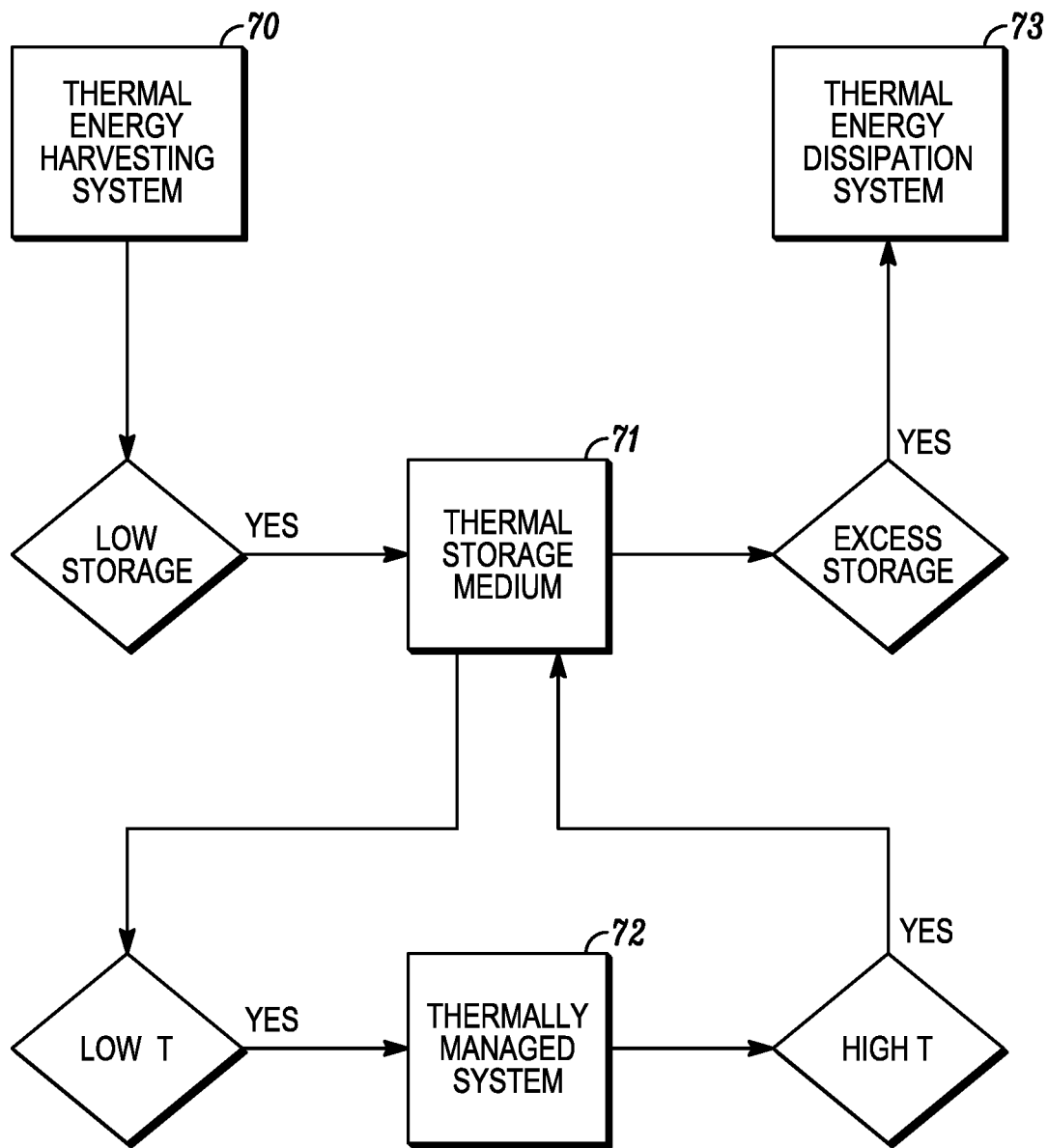
FIG. 7 is a flowchart showing one example of a process for selectively communicating thermal energy using the techniques described herein between and among a thermal energy harvesting system, a thermal energy storage medium, thermally managed system and thermal energy dissipating system.

FIG. 7 is a flowchart showing one example of a process for selectively communicating thermal energy using the techniques described herein between and among a thermal energy harvesting system 70, a thermal energy storage medium 71, thermally managed system 72 and thermal energy dissipating system 73.

ILLUSTRATIVE EXAMPLES

Various use cases are briefly presented below

Thermal managed sub-systems and/or components for High-Altitude, Long-Endurance (HALE) UAV EVs which are targeted for missions at stratospheric altitudes (20-30 km) of weeks, months, or even years duration. For such missions the primary energy source is typically PV solar. The electrical energy storage system is typically a Li-battery pack. The ambient temperature can be in the range of 210-220K. Daily solar insolation (equivalent peak sun hours per day) is both Latitude and seasonally dependent and is at a minimum during the winter solstice (which is for example 3 hr over New York City). Sufficient excess electrical energy has to be generated and stored during the shortest period of insolation of the mission to support continued UAV operations during the remainder of the day. This requirement effectively dictates the UAV design, including the size/required performance of the PV array and the size/energy density of the Li-battery pack. To date, the record HALE UAV endurance is approximately four weeks, in conditions of approximately 7 hours of daily insolation. The mission was terminated, after the battery performance degraded after daily cycling, under non-optimal conditions. This example illustrates a need for an improved power system performance which may, in part, be addressed by improved thermal management, for example (i) implementing coupled PV-battery thermal management practices, with selective distribution and optional intermediate thermal storage capability and/or (ii) integrating thermal energy storage materials, or functionality, into UAV structures such as the airframe in order to minimize added weight or size and/or (iii) integrating thermal storage materials, or functionality, within the battery itself, for similar reasons.

Thermally managed batteries for potentially overheated conditions, with PCM materials dispersed, or integrated, within the battery components, namely the anode, cathode, electrolyte and/or the primary casing with optional and/or selectable interconnectivity to other EV subsystems, or components. These being distinct from batteries which simply have additional encapsulation containing PCM, which may have analogous functionality but at the expense of adding weight and size. In operation, the dispersed or integrated PCM may be selected to absorb thermal energy as the temperature of the battery increases towards a pre-selected upper limit, by undergoing a phase change, such as melting. The ability of the PCM to prevent the battery temperature from exceeding the limit being determined by the specific heat capacity and mass of the PCM and/or ability to additionally dissipate thermal energy from the PCM, or battery, by another thermally conductive pathway, for example a selectable thermal energy pathway to a storage or dissipation subsystem or component outside of the battery, which could be part of the EV structure.

Thermally managed batteries for potentially undercooled conditions, with PCM materials dispersed, or integrated, within the battery components, namely the anode, cathode, electrolyte and/or the primary casing with optional and/or selectable interconnectivity to other EV subsystems, or components. These being distinct from batteries which simply have added encapsulation containing PCM, which may have analogous functionality but at the expense of added weight and size. In operation, the dispersed or integrated PCM may be selected to release thermal energy as the temperature of the battery decreases towards a pre-selected lower limit, by undergoing a phase change, such as solidifying. The ability of the PCM to prevent the battery temperature from dropping under the limit being determined by the specific heat capacity and mass of the PCM and/or ability to additionally absorb thermal energy from the PCM, or battery through another thermally conductive pathway, for example a selectable thermal energy pathway to another subsystem or component outside of the battery with deliverable thermal energy, which could be part of the EV structure.

Integrated and selectively interconnected thermal storage components or sub-systems, which form all, or part, of the EV structure, for example structural frames, or skins. These may include dispersed, or integrated, PCMs, within porous, tubular or nanostructured structural elements, which structural elements provide the mechanical characteristics of the structure. The thermal storage media may include the structural elements themselves and/or PCMs which will enable the selective absorption, or release, of thermal energy from, or to, other interconnected subsystems, or components, when subject to heating or cooling through the transition points. The thermal storage components may further include aerogels or other structured layers for the purpose of thermal insulation/isolation from the surroundings.

Integrated thermal energy conduction pathways or interconnects, which may be predictable, or selectable, are essential building blocks of the thermal energy management systems described herein. These may be variously integrated or interfaced, with the harvesting, dissipating, storing and/or thermally managed subsystems, or components, under consideration. Various materials, for example graphene, or other elemental carbon-based polymorphs, materials, in continuous, layered or nano-structured forms may be employed or composite materials containing these constituents. Such materials and structures are particularly attractive because of their generally high thermal conductivity, robustness and lightweight characteristics. Some parts of the thermal interconnection scheme may require thermal conducting pathways connecting components such as harvesting element and a remotely located thermal storage component. This might be provided by interconnections made from assembled graphene layers. Other parts may require the thermal interfacing of separate components and may be provided by a nanostructured carbon or metallic joining layers. Other parts may require a switchable, or interruptible, thermal connection which might be achieved within a composite material or structure in response to temperature changes. Thermal conduction pathways, thermal interfaces and interruptible elements may also be integral parts, or integrated within, EV structures, including skins or the frame or integral parts of other EV systems, or components, including batteries.

Thermally managed PV arrays on EVs, with interconnections to thermal dissipation and/or storage systems, or components, are an area of great interest. PV arrays can generate substantial thermal energy during the harvesting of electrical energy from Sunlight, or other sources of radiation. The electrical harvesting efficiency of PV cells is higher at low temperatures for example a change of 10% or more may be observed over a range of 25° C.+/−50° C. range. The extraction of thermal energy from PV arrays is therefore a high priority. The same principles of selective thermal conduction and interconnection described in the above examples can be used in this case. In some instances, for instance low temperature environments, it may be more beneficial to store the extracted thermal energy and use this stored energy to maintain battery temperatures. In other instances, for instance high temperature environments, it may more beneficial to dissipate thermal energy to the environment from the surface of an EV.

Microprocessor based sub-systems and components on an EV, can generate substantial thermal energy during operation which must be dissipated to maintain efficient subsystem or component operation. The extraction of thermal energy from such components is therefore a high priority. The same principles of selective thermal conduction and interconnection described in the above examples can be used in this case. In some instances, for instance low temperature environments, it may be more beneficial to store the extracted thermal energy and use the stored energy to maintain battery temperatures. In other instances, for instance high temperature environments, it may more beneficial to dissipate thermal energy to the environment from the surface of an EV.

In the foregoing description, example aspects of the invention are described with reference to specific example embodiments thereof. The specification and drawings are accordingly to be regarded in an illustrative rather than in a restrictive sense. It will, however, be evident that various modifications and changes may be made thereto, in a computer program product or software, hardware, or any combination thereof, without departing from the broader spirit and scope of the present invention.

In addition, it should be understood that the figures, which highlight the functionality and advantages of the present invention, are presented for illustrative purposes only. The architecture of the example aspect of the present invention is sufficiently flexible and configurable, such that it may be utilized (and navigated) in ways other than that shown in the accompanying figures.

Although example aspects herein have been described in certain specific example embodiments, many additional modifications and variations would be apparent to those skilled in the art. It is therefore to be understood that the various example embodiments herein may be practiced otherwise than as specifically described. Thus, the present example embodiments, again, should be considered in all respects as illustrative and not restrictive.

The invention claimed is:

1. A thermal energy management system for an electrically powered vehicle, comprising:
   a thermal energy harvesting subsystem absorbing energy that includes non-thermal energy and converting the non-thermal energy to thermal energy;
   the thermal energy storage medium storing the thermal energy; wherein the thermal energy storage medium includes a battery that stores electrochemical energy in addition to thermal energy;
   a first selectively actuatable thermal energy interconnect, or conduit, selectively transferring the thermal energy between the thermal energy harvesting subsystem and the thermal energy storage medium;
   a thermally managed subsystem to be maintained within an operating range of temperatures; and
   a second selectively actuatable thermal energy interconnect, or conduit, selectively transferring the thermal energy between the thermal storage system and the thermally managed subsystem, the second selectively actuatable thermal energy conduit being configured so that the thermal energy is selectively transferred between the thermal storage medium and the thermally managed subsystem to maintain the thermally managed subsystem within the operating range of temperature.

2. The system of claim 1, wherein the thermal energy storage medium includes one or more phase change material (PCM).

3. The system of claim 2, wherein the PCMs are dispersed in one or more components of the battery.

4. The system of claim 2, in which the thermal energy harvesting subsystem includes a thermo-electric generator for generating electrical energy to be stored in a battery or used to provide energy to other systems of the electrically powered vehicle.

5. The system of claim 3, wherein the PCMs are configured to release thermal energy by undergoing a phase change as the battery temperature decreases to a pre-selected lower limit of the operating range of the battery.

6. The system of claim 3, wherein the PCMs are configured to absorb thermal energy by undergoing a phase change as the battery temperature increases to a pre-selected upper limit of the operating range of the battery.

7. The system of claim 1, wherein the thermal energy harvesting subsystem includes a skin, or a film, extending over a self-supporting surface portion of the vehicle for harvesting and/or dissipating thermal energy.

8. The system of claim 7, wherein the skin or the film includes at least one photovoltaic cell.

9. The system of claim 7, wherein the skin or the film includes an anti-icing (AI) and/or a de-icing (DI) layer.

10. The system of claim 7, wherein the film or the skin is a flexible skin that has a selectively tunable reflectivity.

11. The system of claim 1, wherein the thermally managed subsystems include one or more processors or microprocessors, located on the vehicle.

12. The system of claim 1, wherein the thermal energy harvesting subsystem includes one or more processors, or microprocessors, located on the vehicle, as a source of thermal energy.

13. The system of claim 1, wherein the thermal energy harvesting subsystem includes one or more photovoltaic cells located in a film or a skin, as a source of thermal energy.

14. The system of claim 1, wherein at least one of the first and second interconnects, or conduits, includes conductive material having a tunable, or interruptible, thermal conductivity that is tunable or interruptible by changes in temperature.

15. The system of claim 1, further comprising a first thermally conductive material disposed between the thermal energy harvesting subsystem and the first interconnect, or conduit.

16. The system of claim 15, wherein the thermally conductive material includes a graphene sheet.

17. The system of claim 15, further comprising a second thermally conductive material disposed between the thermal storage medium and the second interconnect, or conduit.

18. The system of claim 1 wherein the second selectively actuatable thermal energy interconnect, or conduit, is configured to selectively transfer thermal energy from the thermal energy storage medium to the thermally managed subsystem and from the thermally managed subsystem to the thermal energy storage medium.

19. A method for managing thermal energy in an electrically powered vehicle, comprising:
    harvesting non-thermal energy and converting the non-thermal energy to thermal energy;
    selectively transferring the thermal energy to a thermal energy storage medium; wherein the thermal energy storage medium includes a battery that stores electrochemical energy in addition to thermal energy;
    a thermally managed subsystem to be maintained within an operating range of temperatures; and
    selectively transferring the thermal energy between the thermal storage medium and the thermally managed subsystem that is to be maintained within an operating range of temperatures so that the thermally managed subsystem is maintained.

20. The method of claim 19 wherein operation and control of the thermally managed subsystem management system includes multi-level management including distinct long-term mission management, medium-term management and instantaneous management, with medium-term management implemented in response to input from pre-existing communication, or sensory, devices in the EV.

21. The method of claim 20 wherein the pre-existing systems include geolocational systems, navigation and/or communication systems.

22. The method of claim 19, wherein the thermal storage system includes centralized, partitioned or distributed thermal storage elements that are configured to operate in a coordinated fashion in response to, or anticipation of, specific thermal management requirements.

23. The method of claim 22 wherein the specific thermal management requirements include extreme temperatures and/or diurnal variations.

* * * * *